United States Patent [19]

Kao et al.

[11] Patent Number: 5,128,742
[45] Date of Patent: Jul. 7, 1992

[54] VARIABLE GAIN SWITCH

[75] Inventors: Yu C. Kao, Pittsburgh; Donald L. Miller, Export; Scott G. Leslie, Pittsburgh, all of Pa.

[73] Assignee: Powerex, Inc., Youngwood, Pa.

[21] Appl. No.: 181,632

[22] Filed: Apr. 14, 1988

[51] Int. Cl.$^5$ .................. H01L 29/72; H01L 29/784
[52] U.S. Cl. ........................ 357/43; 357/34; 357/13; 357/52
[58] Field of Search ............ 357/13, 34, 38, 53, 357/52, 43

[56] References Cited

U.S. PATENT DOCUMENTS 3,566,213  2/1971  Kaiser ..................... 357/13
4,567,502  1/1986  Nakagawa et al. ............ 357/53

FOREIGN PATENT DOCUMENTS 176771  4/1986  European Pat. Off. ......... 357/13

Primary Examiner—William D. Larkins
Attorney, Agent, or Firm—Reed Smith Shaw & McClay

[57] ABSTRACT

A power bipolar transistor has a MOSFET located within the base region, the MOSFET shorting the transistor emitter and base regions together when the bipolar transistor is in an off condition with a large base to collector voltage. The bipolar transistor is provided with floating guard rings, and the gate of the MOSFET is connected to one of these floating guard rings, so that when the depletion region from the base to collector junction reaches this floating guard ring, the MOSFET gate receives a voltage to turn on the MOSFET and provide the emitter to base short.

14 Claims, 4 Drawing Sheets

VARIABLE GAIN SWITCH

FIELD OF THE INVENTION

The present invention is related to variable gain semiconductor switches. More specifically, the present invention is related to a variable gain semiconductor switch that has a transistor and a MOSFET integral therewith to control the gain of the transistor.

BACKGROUND OF THE INVENTION

For high power semiconductor switches, device theory, Y. C. Kao and D. J. Page, "Theoretical Limits for High Voltage Rectifiers and Thyristors, " IEEE-IEDM, Washington, DC (1979), predicts that a scaling up of the blocking voltage capability leads to higher conduction losses and/or longer switching times. The required increase of base width with voltage results in a higher forward voltage drop, hence the higher conduction loss. Alternatively, the increase in forward voltage drop in the high power semiconductor switch may be minimized by increasing the minority-carrier lifetime in the base region. The higher minority-carrier lifetime, also, leads to a longer switching time, aggravating the increase in switching time already resulting from the wider base (i.e., additional stored charge).

To illustrate this point, switching transistors serve as a prime example. Commonly, high power switching transistors are capable of operating in the temperature range between −65 to 200° C. For instance, Powerex Transistor D60T 2N6841 is rated at a breakdown voltage between the collector and emitter with the base opencircuited ($BV_{CEO}$) and at a breakdown voltage between the collector and base with the emitter open circuited ($BV_{CBO}$) of 450 volts and 750 volts, respectively. At a collector current ($I_C$) of 50 amperes and gain ($h_{FE}$) of 10, the voltage between the collector and the emitter ($V_{CE}$) is 2.5 volts. However, Powerex Transistor D60T 4005, which has the same emitter and collector structure as previously mentioned Powerex transistor D60T 2N6841, is rated at $BV_{CEO}$ and $BV_{CBO}$ of 750 volts and 1150 volts, respectively. The voltage drop ($V_{CE}$) at $I_C=20$ amperes and $h_{FE}=10$ is 5.0 volts. An increase of $BV_{CEO}$ by a factor of 1.7 leads to an increase of $V_{CE}$ by a factor of 2 and a decrease of $I_C$ by a factor of 2.5. The increase in $V_{CE}$ contributes both to the conduction and the switching losses in the switching transistors.

To improve the performance of high power semiconductor switches, innovative solutions are needed to increase the blocking voltage without sacrificing either the conduction loss or the switching speed.

SUMMARY OF THE INVENTION

The present invention pertains to a variable gain switch. The variable gain switch is comprised of a semiconductor body. The semiconductor body has a first major surface and an opposing second major surface. The semiconductor body has an N-type collector region disposed adjacent the second major surface which extends to the first major surface. Also there is a P-type base region disposed adjacent the first major surface. The P-type base region contacts the N-type collector region at a first PN junction that extends to the first major surface. There is an N-type emitter region disposed adjacent the first major surface which contacts the P-type base region at a second PN junction that extends to the first major surface. The N-type emitter region is surrounded by the P-type base region and is capable of being a source region of a MOSFET (metal oxide semiconductor field effect transistor). The N-type emitter region forms a transistor together with the N-type collector region and the P-type base region. A second N-type region is disposed adjacent the first major surface and contacts the P-type base region at a third PN junction which extends to the first major surface. The second N-type drain region is spaced from the N-type emitter region and is surrounded by the P-type base region and is capable of being a drain region of the MOSFET. A P-type field limiting region is disposed adjacent the first major surface and contacts the N-type collector region at a fourth PN junction that extends to the first major surface and is capable of being a field limiting junction. The second P-type region is surrounded by the N-type collector region. Additionally, the variable gain switch is comprised of a collector conductive layer. The collector conductive layer is disposed adjacent the second major surface and contacts the N-type collector region. Furthermore, an emitter conductive layer is disposed adjacent the first major surface and contacts the N-type emitter region. There is a base conductive layer disposed adjacent the first major surface which contacts the P-type base region and the second N-type region. A first metal conductive layer is disposed adjacent the first major surface and contacts the P-type field limiting region. Also, a second metal conductive layer is disposed adjacent the first major surface between the base conductive layer and the emitter conductive layer. Moreover, there is a first passivation layer disposed adjacent the first major surface and between the base conductive layer and the emitter conductive layer. The first passivation layer contacts the N-type emitter region, the second N-type region and the P-type region therebetween. The second metal conductive layer and the first passivation layer which is also disposed between the second metal conductive layer and the first major surface, together form a MOSFET gate. The second metal conductive layer is electrically connected to the first metal conductive layer such that an inversion channel is formed in the P-type base region between the N-type emitter region and the second N-type drain region when a sufficiently positive bias voltage exists at the MOSFET gate In a preferred embodiment the variable gain switch includes a plurality of P-type regions disposed adjacent the first major surface and contacting the N-type collector region. The plurality of P-type regions form PN junctions with the N-type collector region. These PN junctions extend to the first major surface and are capable of being field limiting junctions. Each of the plurality of P-type regions is surrounded by the N-type collector region. The first metal conductive layer is disposed adjacent the first major surface and contacts the one P-type region of the plurality of P-type regions which is nearest to the P-type base region. The variable gain switch also includes a second passivation layer disposed adjacent the first major surface and between the base conductive layer and the first metal conductive layer. There is also a third passivation layer disposed adjacent the first major surface layer with the first metal conductive layer between the third passivation layer and the second passivation layer.

Alternatively, the variable gain switch can have the same structure as described above but with the N-type dopant regions replaced with P-type dopant regions, and the P-type dopant regions replaced with N-type dopant regions.

Other details, objects and advantages of the invention will become apparent as the following description of the presently preferred embodiments and presently preferred methods of practicing the invention proceeds.

BRIEF DESCRIPTION OF THE FIGURES

In the accompanying drawings, the preferred embodiments of the invention and preferred methods of practicing the invention are illustrated in which.

DESCRIPTION OF THE PREFERRED EMBODIMENT

Figure 1:
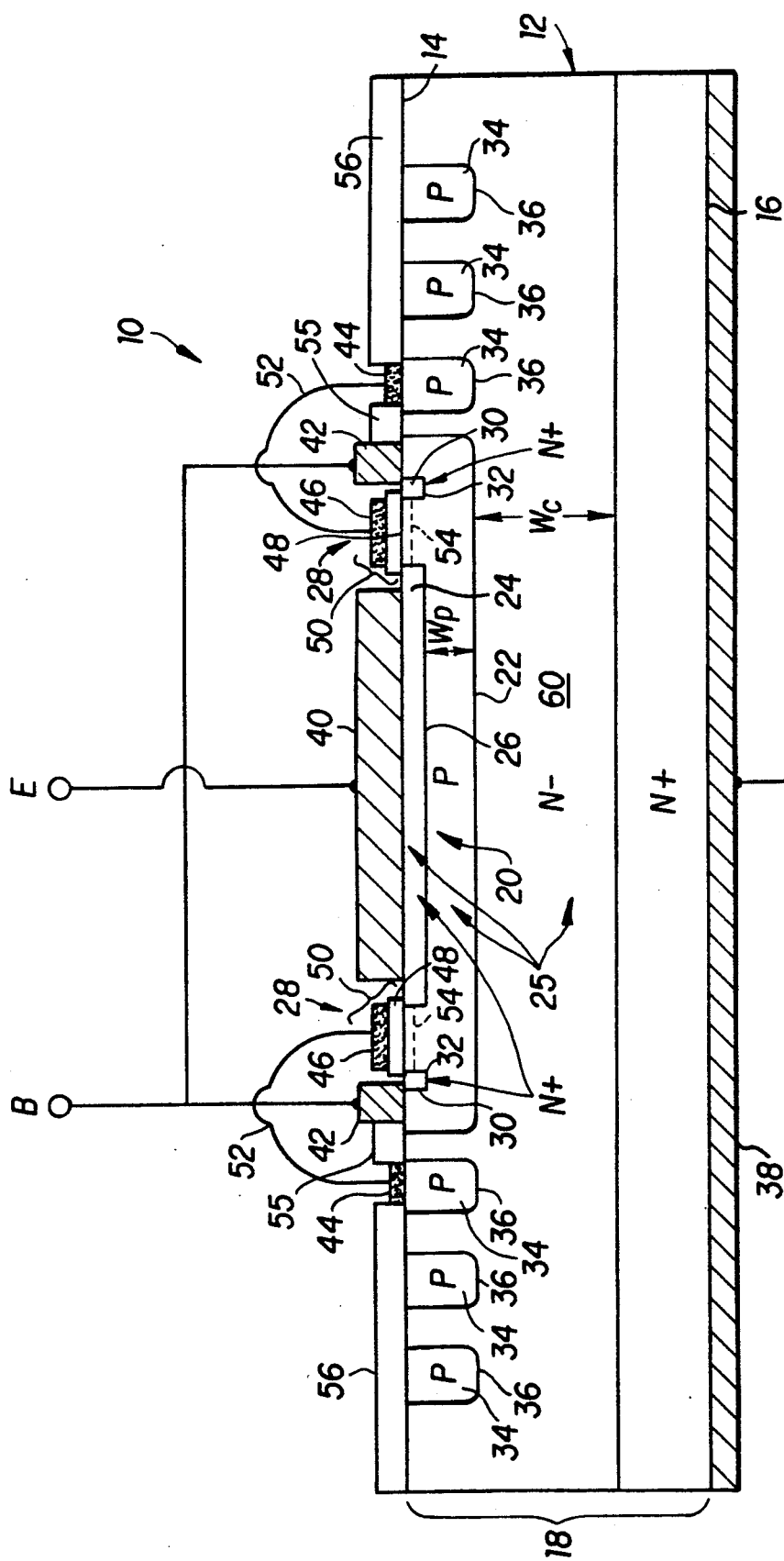
FIG. 1 is a cross-sectional view of the variable gain switch.

Referring particularly to the drawings, like reference numerals are used to designate identical or corresponding parts throughout the views. More particularly in FIG. 1, there is shown a variable gain switch 10. The variable gain switch 10 is comprised of a semiconductor body 12. The semiconductor body 12 has a first major surface 14 and an opposing second major surface 16. The semiconductor body has an N-type collector region 18 disposed adjacent the second major surface 16 which extends to the first major surface 14. Also there is a P-type base region 20 disposed adjacent the first major surface 14. The P-type base region 20 contacts the N-type collector region 18 at a first PN junction 22 that extends to the first major surface 14. There is an N-type emitter region 24 disposed adjacent the first major surface 14 which contacts the P-type base region 20 at a second PN junction 26 that extends to the first major surface 14. The N-type emitter region 24 is surrounded by the P-type base region 20 and is capable of being a source region of a MOSFET 28. The N-type emitter region 24 forms a transistor 25 together with the N-type collector region 18 and the P-type base region 20.

A second N-type region 30 is disposed adjacent the first major surface 14. The second N-type region 30 contacts the P-type base region 20 at a third PN junction 32 which extends to the first major surface 14. The second N-type region 30 is surrounded by the P-type base region 20 and is capable of being a drain region of the MOSFET 28.

At least one P-type field limiting region 34 is spaced from the N-type emitter region 24 and is disposed adjacent the first major surface 14. The P-type field limiting region 34 contacts the N-type collector region 18 at a fourth PN junction 36 that extends to the first major surface 14 and is capable of being a field limiting junction. The P-type field limiting region 34 is surrounded by the N-type collector region 18.

Additionally, the variable gain switch 10 is comprised of a collector conductive layer 38. The collector conductive layer 38 is disposed adjacent the second major surface 16 and contacts the N-type collector region 18. Furthermore, an emitter conductive layer 40 is disposed adjacent the first major surface 14 and contacts the N-type emitter region 24. The first metal conductive layer 40, the collector conductive layer 38, the base conductive layer 42 and the first metal conductive layer 44 are preferably aluminum layers formed by sputtering or evaporation. There is a base conductive layer 42 disposed adjacent the first major surface 14 which contacts the P-type base region 20 and the second N-type region 30. A first metal conductive layer 44 is disposed adjacent the first major surface 14 and contacts the P-type field limiting region 34. Also, a second metal conductive layer 46 is disposed adjacent the first major surface 14 between the base conductive layer 42 and the emitter conductive layer 40. The second metal conductive layer 46 is preferably a sputtered aluminum or phosphorus doped polysilicon layer (Note, all the metal layers described herein can be formed with the use of photomasking techniques).

Figure 2:
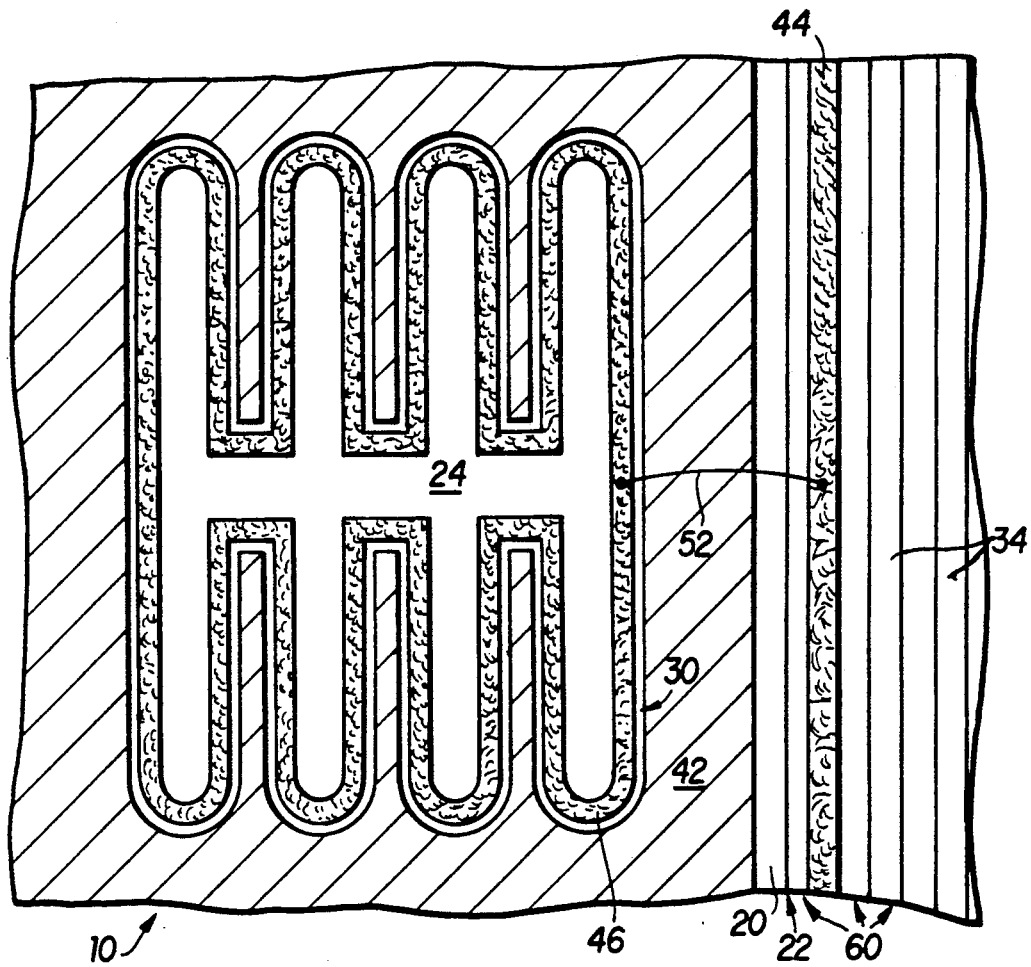
FIG. 2 is an overhead view of a variable switch.

Moreover, there is a first passivation layer 48 disposed adjacent the first major surface 14 and between the base conductive layer 42 and the emitter conductive layer 40. The first passivation layer 48 contacts the N-type emitter region 24, the second N-type region 30 and the P-type base region 20 therebetween. The second metal conductive layer 46 and the first passivation layer 48, which is also disposed between the second metal conductive layer 46 and the first major surface 14, together form a MOSFET gate 50. The second metal conductive layer 46 is electrically connected, for instance by electrical wire 52, as shown in FIG. 1 or in FIG. 2, to the first metal conductive layer 44 such that an inversion channel 54 is formed in the P-type base region 20 between the N-type emitter region 24 and the second N-type region 30 when a sufficiently positive bias voltage exists at the MOSFET gate 50. FIG. 2 is an overhead view of a variable gain switch 10. Since the MOSFET gate 50 is substantially about and preferably completely encircles the N-type emitter region, the variable gain switch 10 in FIG. 2 requires only one electrical connection through electrical wire 52, although more than one electrical wire 52 can be used.

Figure 3:
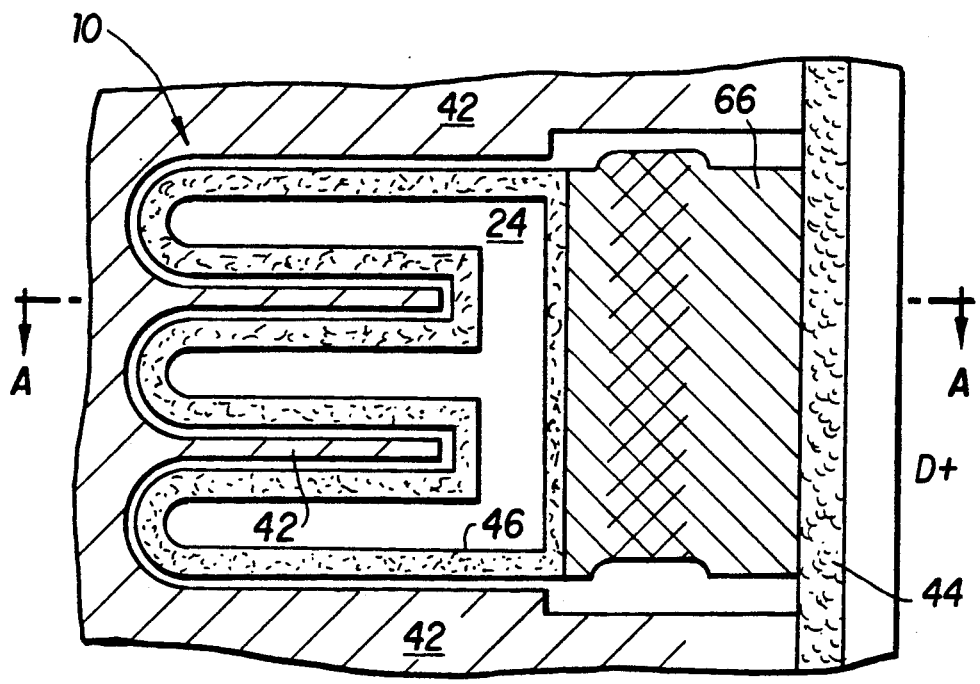
FIG. 3 is an overhead view of a portion of a variable gain switch having a second metallization layer.
Figure 4:
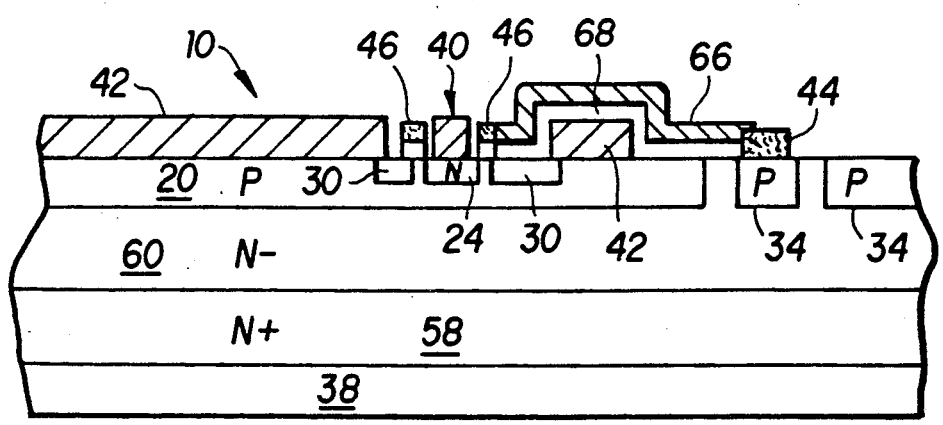
FIG. 4 is a cross-sectional view of a variable gain switch having a second metallization layer.

Alternatively, instead of an electrical wire 52, a second metallization layer 66 can be used to electrically connect the second metal conductive layer 46 to the first metal conductive layer 44. The second metallization layer 66 is preferably aluminum. FIG. 3 is an overhead view of the variable gain switch 10 with the emitter conductive layer 40 not shown to aid understanding of the invention. FIG. 4 is a cross-sectional view along section A—A of FIG. 3 of the variable gain switch 10. FIG. 4 includes the emitter conductive layer 40.

An insulation layer 68 separates the base conductive layer 42 from the second metallization layer 66 and is disposed therebetween. The insulation layer 68 can be made of $SiO_2$, high resistivity poly-silicon or polyimide.

Preferably, the variable gain switch 10 includes a plurality of P-type field limiting regions 34 disposed adjacent the first major surface 14, as shown in FIG. 1. The plurality of P-type field limiting regions 34 contact the N-type collector region 18 and form PN junctions 36 thereat which extend to the first major surface 14 and are capable of being field limiting junctions. Each of the plurality of P-type field limiting regions 34 are surrounded by N-type collector region 18. The first metal conductive layer 44 is disposed adjacent the first major surface 14 and contacts one of the plurality of P-type field limiting regions. Preferably the first metal conductive layer 44 is disposed adjacent the first major surface 14 and contacts the one P-type field limiting region 34 of the plurality of P-type field limiting regions 34 which is nearest to the P-type base region 20. The magnitude of the voltage potential at the MOSFET gate 50 in this embodiment is determined by the spacing between the P-type emitter region and the one P-type field limiting region 34 of the plurality of P-type field limiting regions 34 which is nearest to the P-type base region 20. The voltage of each of the plurality of P-type field limiting regions 34 is determined by the spacing between each of the plurality of P-type field limiting regions 34 and the dopant density of the N-type collector regions 18 between them. See, Y. C. Kao and E. D. Wolley, "High Voltage Planar p-n Junctions," Proc. IEEE 55, p. 1409 (1967). The P-type regions serve to control the electric field strength at the first major surface 14 of the variable gain switch.

The variable gain switch preferably includes a second passivation layer 55 disposed adjacent the first major surface 14 and between the base conductive layer 42 and the first metal conductive layer 44. Preferably there is a third passivation layer 56 disposed adjacent the first major surface layer 14 with the first metal conductive layer 44 between the third passivation layer 56 and the second passivation layer 55. The first passivation layer 48, the second passivation layer 55 and the third passivation layer 56 are preferably made of $S_iO_2$ that is thermally grown on the first major surface 14 of the semiconductor body 12.

Preferably the N-type collector region 18 of the variable gain switch 10 has a heavily doped region 58 that is doped with greater than $10^{16}$ atoms/cm$^3$ of an N-type dopant, and a lightly doped region 60 that is doped with less than $3 \times 10^{14}$ atoms/cm$^3$ of an N-type dopant. The heavily doped region 58 of the N-type collector region 18 is disposed adjacent the second major surface 38. Preferably, the N-type dopant used for the heavily doped region 58 of the N-type collection region 18 is phosphorus. The heavily doped region is formed preferably using a diffusion process. The lightly doped region 60 of the N-type collector region 18 is disposed adjacent the heavily doped region 58 of the N-type collector region 18 and extends to the first major surface 14.

The lightly doped region 60 of the N-type collector region 18 surrounds the P-type base region 20 and the plurality of P-type field limiting regions form PN junctions 36 therewith. The P-type base region 20 and the plurality of P-type field limiting regions 34 are preferably formed by using a boron diffusion or ion implantation process.

The N-type emitter region 24 and the second N-type region is also preferably doped with greater than $10^{16}$ atoms/cm$^3$ of an N-type dopant. This N-type emitter region 24 and the second N-type region 30 are preferably formed by using a phosphorous diffusion or implantation process.

In a preferred embodiment, a phosphorus doped N-type silicon wafer serves as the starting material for the variable gain switch 10 and is the basis for the semiconductor body 12. The lightly doped region 60 of the N-type collector region 18 is doped with $2.3 \times 10^{14}$ atoms/cm$^3$. The lightly doped region 60 of the N-type collector region 18 has a width of $70 \times 10^{-4}$ cm. The P-type base region 20 is doped with $5 \times 10^{17}$ atoms/cm$^3$ of a P-type dopant, has a depth of $23 \times 10^{-4}$ cm and a width of $17 \times 10^{-4}$ cm. The N-type emitter region is doped with $5 \times 10^{19}$ atoms/cm$^3$ of an N-type dopant and has a depth of $6 \times 10^{-4}$ cm. The MOSFET gate 50 has a threshold bias voltage potential of between 15 and 20 volts.

Figure 5:
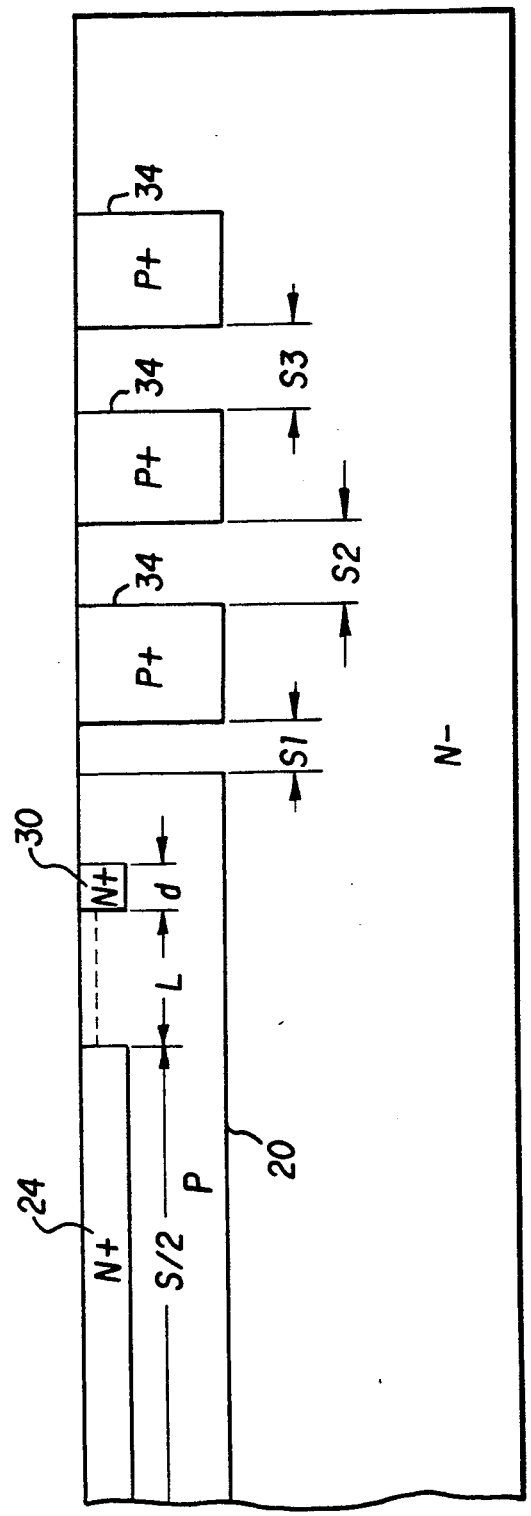
FIG. 5 is a cross-sectional view of a portion of the variable gain switch.

In the preferred embodiment, the spacing S1, as shown in FIG. 5, is such that the threshold bias voltage potential of the MOSFET gate 50 is exceeded when a punchthrough voltage is present between the P-type base region 20 and the nearest P-type field limiting region 34. The spacing S1 is between $9-11 \times 10^{-4}$ cm. Similarly, spacing $S_2$ and $S_3$ between the nearest and second nearest, and second nearest and third nearest P-type field limiting regions 34, respectively, to the P-type base region 20 are both $42 \times 10^{-4}$ cm. The N-type emitter region 24 has a width S which is preferably no more than twice the electron diffusion length in the P-type base region 20. For an electron lifetime in the P-type base region 20 of 1 μs, the N-type emitter region width should be no more than $120 \times 10^{-4}$ cm. The total N-type emitter region 24 length should be 250 to 340 cm; thus having an area of 3 to 4 cm$^2$. The variable gain switch 10 is 50 mm in diameter.

In the preferred embodiment, the inversion channel 54 length of the MOSFET 28 is between 3 to $5 \times 10^{-4}$ cm. The current ($I_{CH}$) which flows through the inversion channel produces a potential drop ($V_D$). It can be calculated from the expression $$I_{CH} = \frac{Z \mu_n C_i}{L}\left[(V_G - V_T)V_D - \frac{V_D^2}{2}\right] \quad (1)$$

where Z = the width of the channel
$C_i$ = passivation capacitance
L = channel length
$V_G$ = gate voltage
$V_T$ = threshold voltage.

With the following values in Equation (1):

| | |
|---|---|
| channel width = | 150 cm (equal to emitter length) |
| channel length = | 5 μm and 3 μm |
| SiO$_2$ layer thickness = | 1000 A |
| electron mobility = | 100 cm$^2$/v-s |
| gate voltage = | 20 volts |
| threshold voltage = | 10 volts |
| channel potential drop = | 0.4 volt. |

The calculated values of inversion channel 54 current for channel lengths of $5 \times 10^{-4}$ cm and $3 \times 10^{-4}$ cm are 3.90 amperes and 6.59 amperes, respectively.

The variable gain switch 10 is believed to operate in the following manner In the blocking state, a positive potential at the field limiting region 34 nearest to the P-type base region 20, which functions as a field limiting junction and contacts the first metal layer 44, results in a positive bias voltage being applied at the gate 50 of the MOSFET 28. If the bias voltage is larger than the threshold voltage, the MOSFET 28 is turned on. The inversion channel 54 connecting the highly doped N-type emitter region 24 and the second highly doped N-type region 30 at the first major surface (see FIG. 1), provides a shunting path between the emitter and base conductive layers 40, 42. Electric currents are thereby diverted from the highly doped N-type emitter region to the shunting paths for low values of inversion channel 54 resistance. The current gain of the transistor 25 is practically zero since there is no injection of minority carriers from the highly doped N-type emitter region to the P-type base region. In this condition the transistor 25 behaves like a diode and its BV$_{CEO}$ is equal to BV$_{CBO}$.

In the switching mode, base current is applied through the base conductive layer 42. Initially, a portion of the base current flows through the inversion channel 52 and a fraction through the highly doped N-type emitter region 24. The fraction of the base current flowing through the highly doped N-type emitter region 24 is enhanced by two important facts: 1) the MOSFET inversion channel saturates at higher current levels; 2) as electron injection increases at the highly doped N-type emitter region 24, an increase in current gain results. If the base current is large enough, the time when the potential difference between the field limiting region 34 nearest to the P-type base region 20 and the base conductive layer falls below the threshold voltage of the MOSFET 28, the inversion channel is turned off and the transistor 25 assumes its normal high current gain condition. In summary, the variable gain switch 10 behaves like a diode in the blocking state and a transistor in the conducting state.

In an alternative embodiment, the variable gain switch 10 can have the same structure as described above but with the N-type dopant regions replaced with P-type dopant regions, and the P-type dopant regions replaced with N-type dopant regions. Thus, the N-type collector region 18, the N-type emitter region 24, the second N-type region 30 are instead a P-type collector region 18, a P-type emitter region 24 and a second P-type region 30. The P-type base region 20 and the P-type field limiting region 34 are instead an N-type base region 20 and an N-type field limiting region 34. Accordingly, a sufficiently negative bias voltage is present to establish an inversion channel in the embodiment.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

We claim:

1. A variable gain switch comprising:
a semiconductor body, said semiconductor body having a first major surface and opposing second major surface, said semiconductor body having an N-type collector region disposed adjacent the second major surface and extending to said first major surface, a P-type base region disposed adjacent the first major surface and contacting said N-type collector region at a first PN junction extending to said first major surface, an N-type emitter region disposed adjacent said first major surface and contacting said P-type base region at a second PN junction extending to the first major surface, said N-type emitter region being surrounded by said P-type base region and capable of being a source region of a MOSFET, said N-type emitter region forming a transistor together with said N-type collector region and said P-type base region, a second N-type region disposed adjacent said first major surface and contacting said P-type base region at a third PN junction extending to the first major surface, said second N-type region spaced from the N-type emitter region and being surrounded by said P-type base region and capable of being a drain region of the MOSFET, a P-type field limiting region disposed adjacent the first major surface and contacting said N-type collector region at a fourth PN junction extending to the first major surface, which is capable of being a field limiting junction, said second P-type field limiting region being surrounded by said N-type collector region;
a collector conductive layer disposed adjacent the second major surface and contacting the N-type collector region;
an emitter conductive layer disposed adjacent the first major surface and contacting the N-type emitter region;
a base conductive layer disposed adjacent the first major surface and contacting the P-type base region and the second N-type region;
a first metal conductive layer disposed adjacent the first major surface and contacting the P-type field limiting region;
a second metal conductive layer disposed adjacent the first major surface between the base conductive layer and the emitter conductive layer; and
a first passivation layer disposed adjacent the first major surface and between the base conductive layer and the emitter conductive layer and contacting the N-type emitter region, the second N-type region and the P-type base region therebetween, said second metal conductive layer and said first passivation layer, which is also disposed between the second metal conductive layer and the first major surface, together forming a MOSFET gate, said second metal conductive layer electrically connected to said first metal conductive layer to provide an internal bias such that an inversion channel is formed in the P-type base region between the N-type emitter region and the second N-type source region when a positive bias voltage exists at the MOSFET gate.

2. A variable gain switch as described in claim 1 including a plurality of P-type regions disposed adjacent the first major surface and contacting said N-type collector region and forming PN junctions thereat which extend to the first major surface and which are capable of being field limiting junctions, each of said plurality of P-type regions being surrounded by said N-type collector region, said first metal conductive layer disposed adjacent the first major surface and contacting one of the plurality of P-type regions.

3. A variable gain switch as described in claim 2 wherein the first metal conductive layer is disposed adjacent the first major surface and contacts the one P-type region of the plurality of P-type regions which is nearest to the P-type base region.

4. A variable gain switch as described in claim 3 including a second passivation layer disposed adjacent the first major surface and between the base conductive layer and the first metal conductive layer, and a third passivation layer disposed adjacent the first major surface layer with the first metal conductive layer between the third passivation layer and the second passivation layer.

5. A variable gain switch as described in claim 4 wherein the N-type collector region has a heavily doped region that is doped with greater than $10^{16}$ atoms/cm$^3$ of an N-type dopant, and a lightly doped region that is doped with less than $10^{14}$ atoms/cm$^3$ of an N-type dopant, said heavily doped region of the N-type collector region disposed adjacent the second major surface, said lightly doped region of the N-type collector region disposed adjacent the heavily doped region of the N-type collector region and extending to said first major surface, said lightly doped region of the N-type collector region surrounding the P-type base region and the plurality of P-type field limiting regions and forming PN junctions therewith, and said second N-type region is doped with greater than $10^{16}$ atoms/cm$^3$ of an N-type dopant.

6. A variable gain switch as described in claim 4 including at least one electrical wire which is connected to the second metal conductive layer and the first metal conductive layer.

7. A variable gain switch as described in claim 3 including a second metallization layer which is connected to the second metal conductive layer and the first metal conductive layer, and an insulation layer which separates the base conductive layer from the second metallization layer and is disposed therebetween.

8. A variable gain switch comprising:
a semiconductor body, said semiconductor body having a first major surface and opposing second major surface, said semiconductor body having a P-type collector region disposed adjacent the second major surface and extending to said first major surface, an N-type base region disposed adjacent the first major surface and contacting said P-type collector region at a first PN junction extending to said first major surface, a P-type emitter region disposed adjacent said first major surface and contacting said N-type base region at a second PN junction extending to the first major surface, said P-type emitter region being surrounded by said N-type base region and capable of being a source region of a MOSFET, said P-type emitter region forming a transistor together with said P-type collector region and said N-type base region, a second P-type region disposed adjacent said first major surface and contacting said N-type base region at a third PN junction extending to the first major surface, said second P-type region being surrounded by said N-type base region and capable of being a drain region of the MOSFET, an N-type field limiting region disposed adjacent the first major surface and contacting said P-type collector region at a fourth PN junction extending to the first major surface, which is capable of being a field limiting junction, said second N-type field limiting region being surrounded by said P-type collector region;
a collector conductive layer disposed adjacent the second major surface and contacting the P-type collector region;
an emitter conductive layer disposed adjacent the first major surface and contacting the P-type emitter region;
a base conductive layer disposed adjacent the first major surface and contacting the N-type base region and the second P-type region;
a first metal conductive layer disposed adjacent the first major surface and contacting the N-type field limiting region;
a second metal conductive layer disposed adjacent the first major surface between the base conductive layer and the emitter conductive layer; and
a first passivation layer disposed adjacent the first major surface and between the base conductive layer and the emitter conductive layer and contacting the P-type emitter region, the second P-type region and the N-type base region therebetween, said second metal conductive layer and said first passivation layer, which is also disposed between the second metal conductive layer and the first major surface, together forming a MOSFET gate, said second metal conductive layer electrically connected to said first metal conductive layer to provide an internal bias such that an inversion channel is formed in the N-type base region between the P-type emitter region and the second P-type source region when a sufficiently negative bias voltage exists at the MOSFET gate.

9. A variable gain switch as described in claim 8 including a plurality of N-type regions disposed adjacent the first major surface and contacting said P-type collector region and forming PN junctions thereat which extend to the first major surface and which are capable of being field limiting junctions, each of said plurality of N-type regions being surrounded by said P-type collector region, said first metal conductive layer disposed adjacent the first major surface and contacting one of the plurality of N-type regions.

10. A variable gain switch as described in claim 9 wherein the first metal conductive layer is disposed adjacent the first major surface and contacts the one N-type region of the plurality of N-type regions which is nearest to the N-type base region.

11. A variable gain switch as described in claim 10 including a second passivation layer disposed adjacent the first major surface and between the base conductive layer and the first metal conductive layer, and a third passivation layer disposed adjacent the first major surface layer with the first metal conductive layer between the third passivation layer and the second passivation layer.

12. A variable gain switch as described in claim 11 wherein the P-type collector region has a heavily doped region that is doped with greater than $10^{16}$ atoms/cm$^3$ of a P-type dopant, and a lightly doped region that is doped with less than $10^{14}$ atoms/cm$^3$ of a P-type dopant, said heavily doped region of the P-type collector region disposed adjacent the second major surface, said lightly doped region of the P-type collector region disposed adjacent the heavily doped region of the P-type collector region and extending to said first major surface, said lightly doped region of the P-type collector region surrounding the N-type base region and the plurality of N-type field limiting regions and forming PN junctions therewith, and said second P-type region is doped with greater than $10^{16}$ atoms/cm$^3$ of an P-type dopant.

13. A variable gain switch as described in claim 11 including at least one electrical wire which is connected between the second metal conductive layer and the first metal conductive layer.

14. A variable gain switch as described in claim 10 including a second metallization layer which is connected to the second metal conductive layer and the first metal conductive layer, and an insulation layer which separates the base conductive layer from the second metallization layer and is disposed therebetween.

* * * * *